US009954540B1

(12) United States Patent
YangGong et al.

(10) Patent No.: US 9,954,540 B1
(45) Date of Patent: Apr. 24, 2018

(54) ASYMMETRIC LOCKING TECHNIQUE FOR ASYMMETRIC FREQUENCY LOCKED LOOP

(71) Applicant: Oracle International Corporation, Redwood Shores, CA (US)

(72) Inventors: Yifan YangGong, Milpitas, CA (US); Sebastian Turullols, Los Altos, CA (US); Changku Hwang, Morgan Hill, CA (US); Nicolas M. Huynh, San Jose, CA (US); Daniel S. Woo, San Francisco, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/462,514

(22) Filed: Mar. 17, 2017

(51) Int. Cl.
  *H03L 7/099* (2006.01)
  *H03L 7/081* (2006.01)
  *H03L 5/00* (2006.01)
  *H03L 7/07* (2006.01)

(52) U.S. Cl.
  CPC .............. *H03L 7/0991* (2013.01); *H03L 5/00* (2013.01); *H03L 7/07* (2013.01); *H03L 7/0818* (2013.01)

(58) Field of Classification Search
  CPC ........ H03L 7/0991; H03L 7/07; H03L 7/0818; H03L 5/00
  See application file for complete search history.

(56) References Cited

U.S. PATENT DOCUMENTS 8,604,852 B1 * 12/2013 Turullols .................. H03L 7/07
  327/159

* cited by examiner

*Primary Examiner* — Jung Kim
(74) *Attorney, Agent, or Firm* — Park, Vaughan, Fleming & Dowler LLP

(57) ABSTRACT

A system that generates a click signal includes a first digitally controlled oscillator (DCO) having a first fundamental frequency, and a second DCO having a second fundamental frequency. The system also includes a Muller C-element, which combines outputs of the first and second DCOs to produce the clock signal, which feeds back into the first and second DCOs. During a calibration operation, while the second DCO is set to a frequency larger than the target frequency, the system adjusts the first DCO with reference to a first feedback loop, which includes the first DCO, so that the clock signal matches the target frequency, and while the first DCO is set to the adjusted first fundamental frequency plus a frequency offset, the system adjusts the second DCO with reference to a second feedback loop, which includes the second DCO, so that the clock signal matches the target frequency.

20 Claims, 6 Drawing Sheets

ASYMMETRIC LOCKING TECHNIQUE FOR ASYMMETRIC FREQUENCY LOCKED LOOP

BACKGROUND

Field

The disclosed embodiments relate to clock-generation circuits that generate clock signals for integrated circuits, such as a processor chip. More specifically, the disclosed embodiments relate to a clock-generation circuit having an asymmetric frequency-locked loop (AFLL), which includes digitally controlled oscillators (DCOs), and which adjusts a clock frequency based on variations in a power-supply voltage.

Related Art

The operating frequency of an integrated circuit is typically specified at the lowest acceptable power-supply voltage ($V_{low}$) for a critical path in the integrated circuit, i.e., the power-supply voltage for which the critical path has a non-zero timing margin. In addition, the power consumption of the integrated circuit is usually specified at the average power-supply voltage ($V_{nominal}$). In general, clock-generating circuits are designed to be stable and not to track variations in the power-supply voltage, such as changes associated with power-supply noise. Thus, ideally there is a fixed difference between $V_{nominal}$ and $V_{low}$ during operation of the integrated circuit.

However, in practice the power-supply voltage usually decreases when there is an increase in the power consumption of the integrated circuit. In particular, when a transient increase in the power-supply current occurs, the inductance (L) through a chip package of the integrated circuit can result in a voltage loss $$\left(L\frac{di}{dt}\right).$$

This voltage loss can possibly cause a failure on a critical path because of an insufficient timing margin caused by the voltage loss.

In addition, the combination of the inductance L and on-chip capacitances can produce a resonance frequency between 50-100 MHz, which can produce oscillation in the power-supply voltage. This is shown in FIG. 1, which illustrates an electronic resonance associated with a chip package for an integrated circuit. Note that if the power-supply voltage drops below $V_{low}$, an error may arise in a critical path in the integrated circuit because of an insufficient timing margin.

As critical dimensions in integrated circuits continue to decrease, the sensitivity of the integrated circuits to these power-supply effects increases. This is because smaller critical dimensions are typically associated with higher clock frequencies, which increases power consumption and, thus, increases voltage droop. Furthermore, as clock frequencies increase, the resonance frequency associated with the chip package may fall within the operating bandwidth of the integrated circuit and, thus, of the power-supply distribution system. (However, note that the voltage variations associated with this resonance frequency are typically at too high of a frequency to be addressed by a voltage regulator module in the power-supply distribution system, so it is not possible to deal with this resonance problem by simply changing the design of the voltage regulator module.) Collectively, these effects may require additional voltage margin to be added when designing integrated circuits to ensure proper operation, and this additional voltage margin may increase cost, complexity and time to market for the integrated circuit.

In an effort to reduce this additional voltage margin, an asymmetric frequency locked loop (AFLL) has been developed to change the clock frequency in response to power supply voltage changes. (See U.S. Pat. No. 9,312,864, entitled "AFLL with Increased Timing Margin" by inventors Yifan YangGong, et al., filed on 26 Sep. 2014 and issued on 16 Apr. 2016.) The AFLL described in this patent locks two digitally controlled oscillators to the same target frequency. However, when the outputs of the two DCOs, which are locked to the same target frequency, are combined at a C-element, the C-element introduces additional delay, which causes the clock-generation circuit to deviate from the target frequency. In order to deal with this deviation, it is necessary to introduce additional voltage margin.

Hence, what is needed is a clock-generation circuit, which does not suffer from the above-described problems.

SUMMARY

One embodiment of the present disclosure provides a system that generates a clock signal, which compensates for power-supply voltage variations in an integrated circuit. This system includes a first digitally controlled oscillator (DCO) having a first fundamental frequency, and a second DCO having a second fundamental frequency. The system also includes a Muller C-element, which combines outputs of the first and second DCOs to produce the clock signal, which feeds back into the first and second DCOs. The system additionally includes control logic that calibrates the first and second DCOs with respect to a target frequency by performing the following operations: while the second DCO is set to a frequency that is larger than the target frequency, the system adjusts the first fundamental frequency of the first DCO with reference to a first feedback loop, which includes the first DCO, so that the clock signal matches the target frequency; and while the first DCO is set to the adjusted first fundamental frequency plus a frequency offset, the system adjusts the second fundamental frequency of the second DCO with reference to a second feedback loop, which includes the second DCO, so that the clock signal matches the target frequency.

In some embodiments, adjusting the first fundamental frequency of the first DCO involves adjusting a coarse control code for the first DCO, and subsequently adjusting a fine control code for the first DCO. Similarly, adjusting the second fundamental frequency of the second DCO involves adjusting a coarse control code for the second DCO, and subsequently adjusting a fine control code for the second DCO.

In some embodiments, the first DCO is associated with a critical path having a gate-dominated delay characteristic (wherein the delay through the critical path is primarily determined by gate delays), and the second DCO is associated with a critical path having a wire-dominated delay characteristic (wherein the delay through the critical path is primarily determined by wire delays).

In some embodiments, the first DCO is associated with a critical path having a wire-dominated delay characteristic, and the second DCO is associated with a critical path having a gate-dominated delay characteristic.

In some embodiments, during normal operation of the clock-generation circuit, the Muller C-element selects the slowest of the outputs of the first and second DCOs. In this way, during a voltage undershoot of the power supply voltage, the gate-dominated delay characteristic determines the speed of the clock signal, and during a voltage overshoot of the power supply voltage, the wire-dominated delay characteristic determines the speed of the clock signal.

In some embodiments, during the calibration operations for the clock-generation circuit, the control logic selectively enables the first feedback loop and the second feedback loop, and during normal operation of the clock-generation circuit, the control logic disables the first feedback loop and the second feedback loop.

In some embodiments, the power-supply voltage variations are associated with: a time-varying power-supply current; and an inductance of a chip package that includes the integrated circuit.

In some embodiments, the target frequency falls in a range from 2 GHz to 5 GHz, and the frequency offset increases the frequency of the first DCO by 0.5 ps to 127.5 ps.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
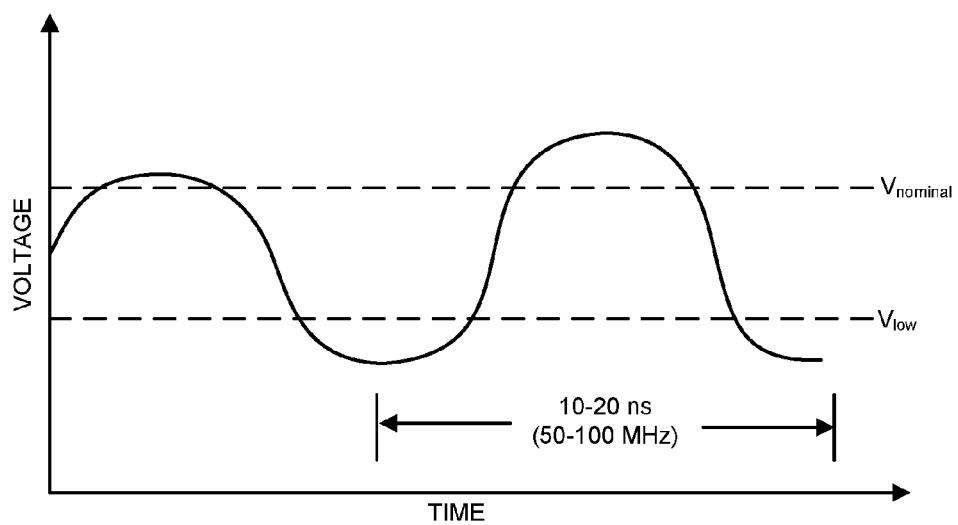
FIG. 1 presents a drawing illustrating an electronic resonance associated with a chip package.
Figure 2:
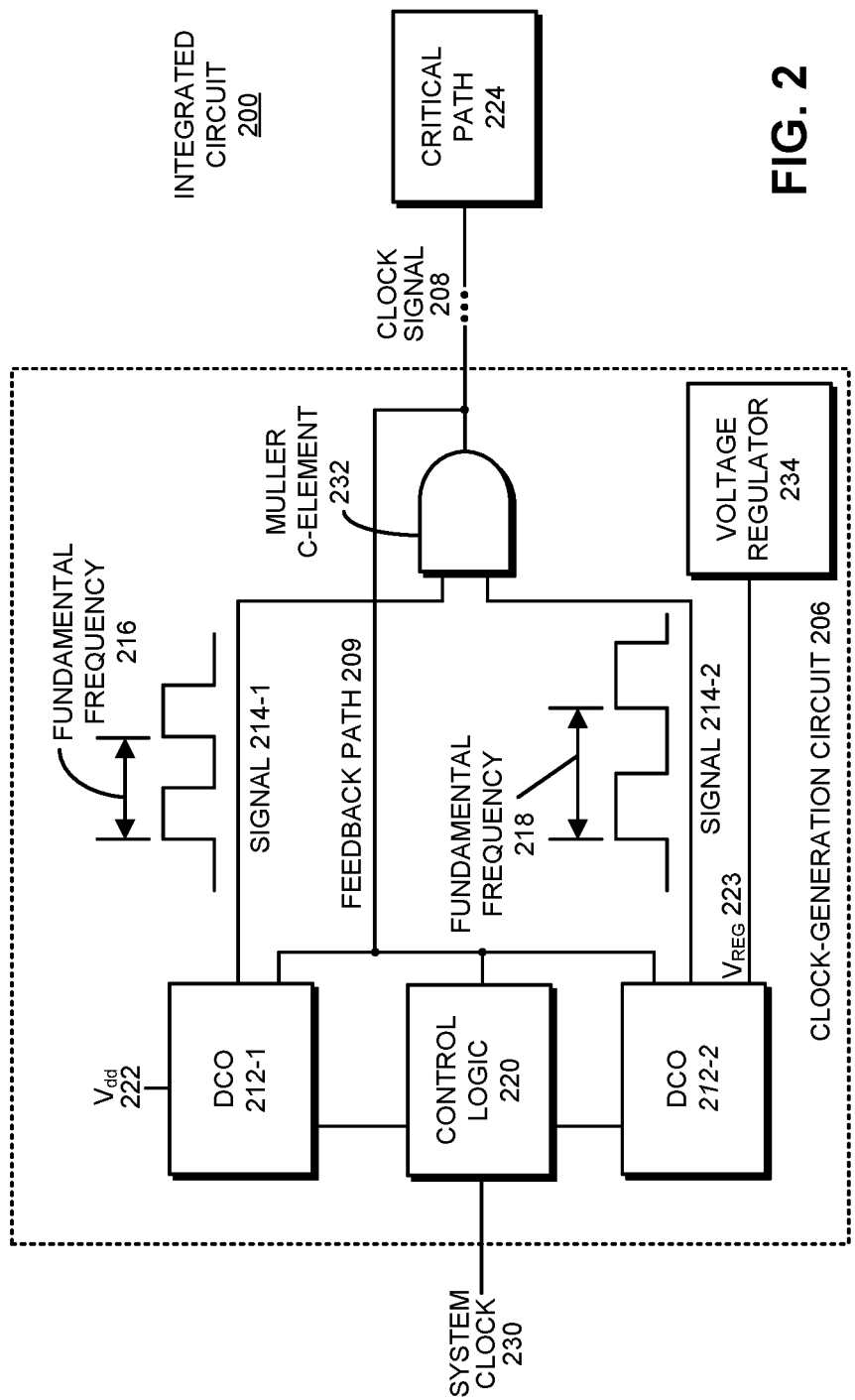
FIG. 2 presents a block diagram illustrating an integrated circuit that includes a clock-generation circuit in accordance with the disclosed embodiments.

FIG. 2 presents a block diagram illustrating an integrated circuit 200 that includes a clock-generation circuit 206, which generates a clock signal 208 for a critical path 224 in integrated circuit 200. Clock-generation circuit 206 includes a digitally controlled oscillator (DCO) 212-1 that creates an output signal 214-1 having fundamental frequency 216, and a DCO 212-2 that creates an output signal 214-2 having fundamental frequency 218. Clock-generation circuit 206 also includes Muller C-element 232 that receives output signals 214-1 and 214-2 and selects the latest-arriving edges in received output signals 214-1 and 214-2 to produce a clock signal 208, which passes through a feedback path 209 into DCOs 212-1 and 212-2 and control logic 220. Control logic 220 also receives a system clock 230, which is used as a target frequency for calibrating DCOs 212-1 and 212-2.

In some embodiments, the power-supply voltage of DCO 212-2 is provided by a voltage regulator 234. In particular, if DCO 212-2 has a wire-dominated delay characteristic, which is described in more detail below, DCO 212-2 may receive a regulated voltage $V_{REG}$ 223 from voltage regulator 234 (and, thus, may receive an approximately constant voltage). At the same time, the other DCO 212-1 may receive a noisier power-supply voltage $V_{dd}$ 222.

Clock-generation circuit 206 is specially designed to reduce the impact of power-supply voltage variations on critical path 224 in integrated circuit 200, and may thereby prevent failures on critical path 224 associated with power-supply overshoot and undershoot conditions. Note that these power-supply voltage variations may be caused by the inductance of the chip package that includes integrated circuit 200, and may also be caused by a time-varying power-supply current, such as L(di/dt) induced power-supply voltage noise.

Feedback Loop

Figure 3:
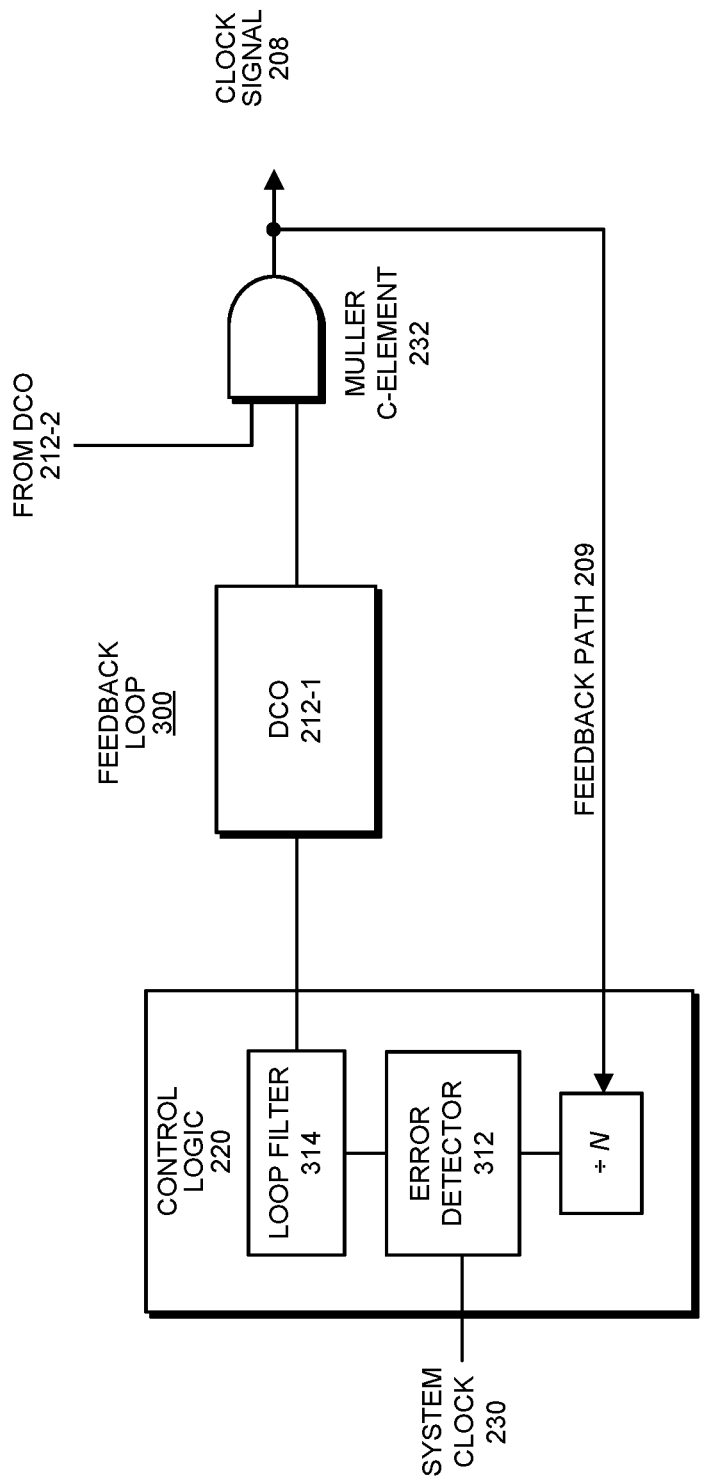
FIG. 3 present a block diagram illustrating a feedback loop in the clock-generation circuit in accordance with the disclosed embodiments.

FIG. 3 presents a block diagram illustrating a feedback loop 300 that is part of clock-generation circuit 206 in FIG. 2 in accordance with the disclosed embodiments. Feedback loop 300 is used to calibrate DCO 212-1 with reference to system clock 230, which provides a target frequency, as is described in more detail below.

Note that clock-generation circuit 206 actually includes two feedback loops. A first feedback loop 300, which is illustrated in FIG. 3, is used to calibrate DCO 212-1, and a second feedback loop, which is not illustrated in FIG. 3, is used to calibrate the other DCO 212-2.

As is described above with reference to FIG. 2, Muller C-element 232 combines an output signal from DCO 212-1 with an output signal from DCO 212-2 to produce clock signal 208, wherein clock signal 208 is returned to control logic 220 through feedback path 209. Within control logic 220, clock signal 208 is divided by N (if necessary) and is then compared using error detector 312 against a target frequency provided by system clock signal 230. The output of error detector 312 feeds through a loop filter 314 and is subsequently used to adjust DCO 212-1 to calibrate clock signal 208 with reference to system clock 230. Control logic 220 also includes similar calibration circuitry (not shown), which implements a second feedback loop, to calibrate DCO-212-2.

DCO Structure

Figure 4:
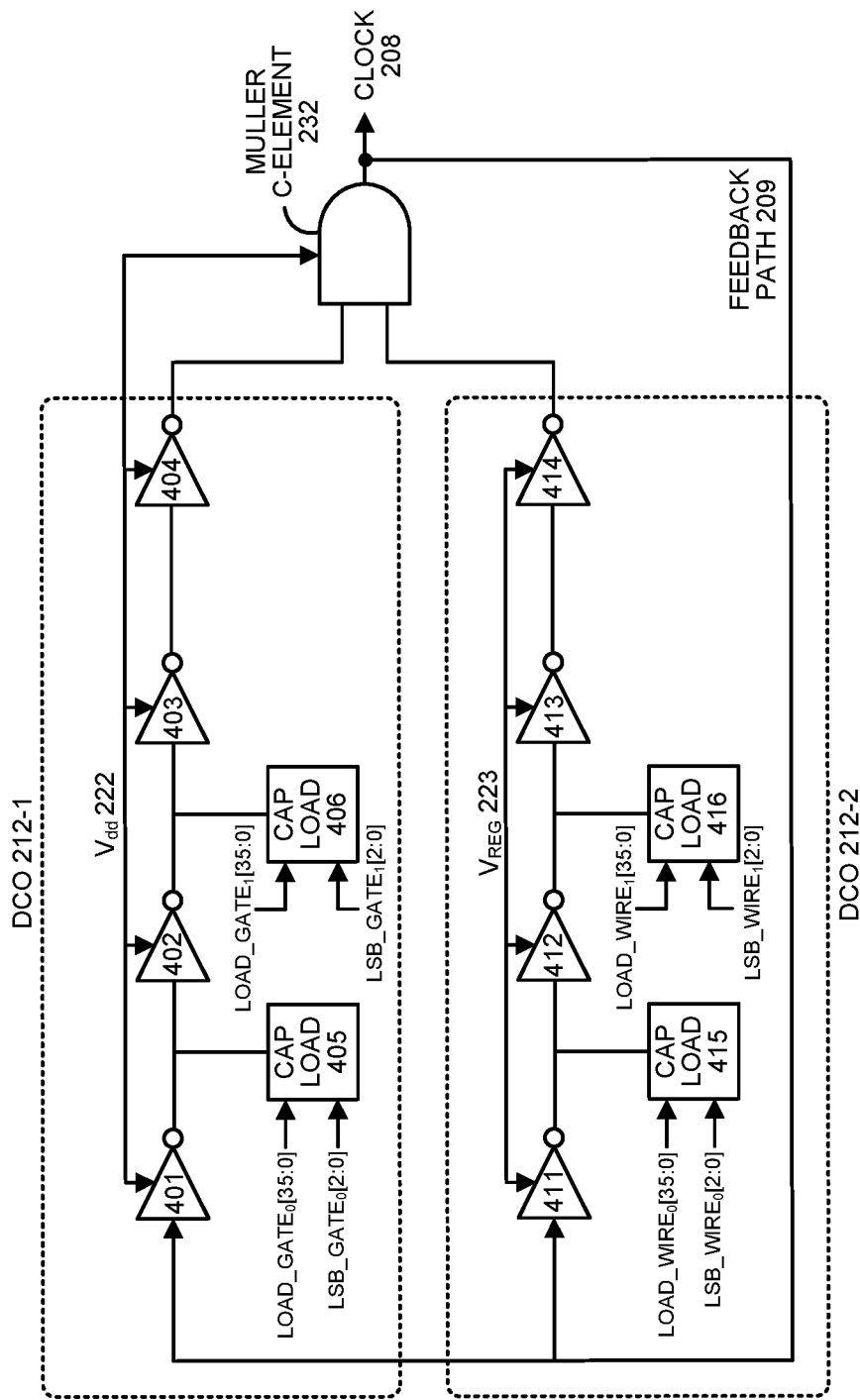
FIG. 4 presents a block diagram illustrating the internal structure of DCOs 212-1 and 212-2 in accordance with the disclosed embodiments.

FIG. 4 presents a block diagram illustrating the internal structure of DCOs 212-1 and 212-2 in accordance with the disclosed embodiments. As illustrated in FIG. 2, the outputs of DCOs 212-1 and 212-2 feed into Muller C-element 232, which generates a clock signal 208 that passes through feedback path 209 into DCOs 212-1 and 212-2. Referring to FIG. 4, DCO 212-1 comprises a chain of inverters 401-404, wherein the first two inverters 401 and 402 have programmable capacitive loads 405 and 406, which are controlled by a fine control code. Note that an associated coarse control code (not shown) controls the driver strength for all four of the inverters 401-404. Also note that Muller C-element 232 performs an inversion, so the ring, which includes the four inverters 401-404 and Muller C-element 232, performs an odd number of inversions and therefore oscillates.

Similarly, DCO 212-2 comprises a chain of inverters 411-414, wherein the first two inverters 411 and 412 have programmable capacitive loads 415 and 416, which are controlled by a fine control code, and wherein an associated coarse control code (not shown) controls the driver strength for all four inverter stages 411-414. The calibration operation, which sets these coarse and fine control codes, is described in more detail below.

Calibration Procedure

Figure 5:
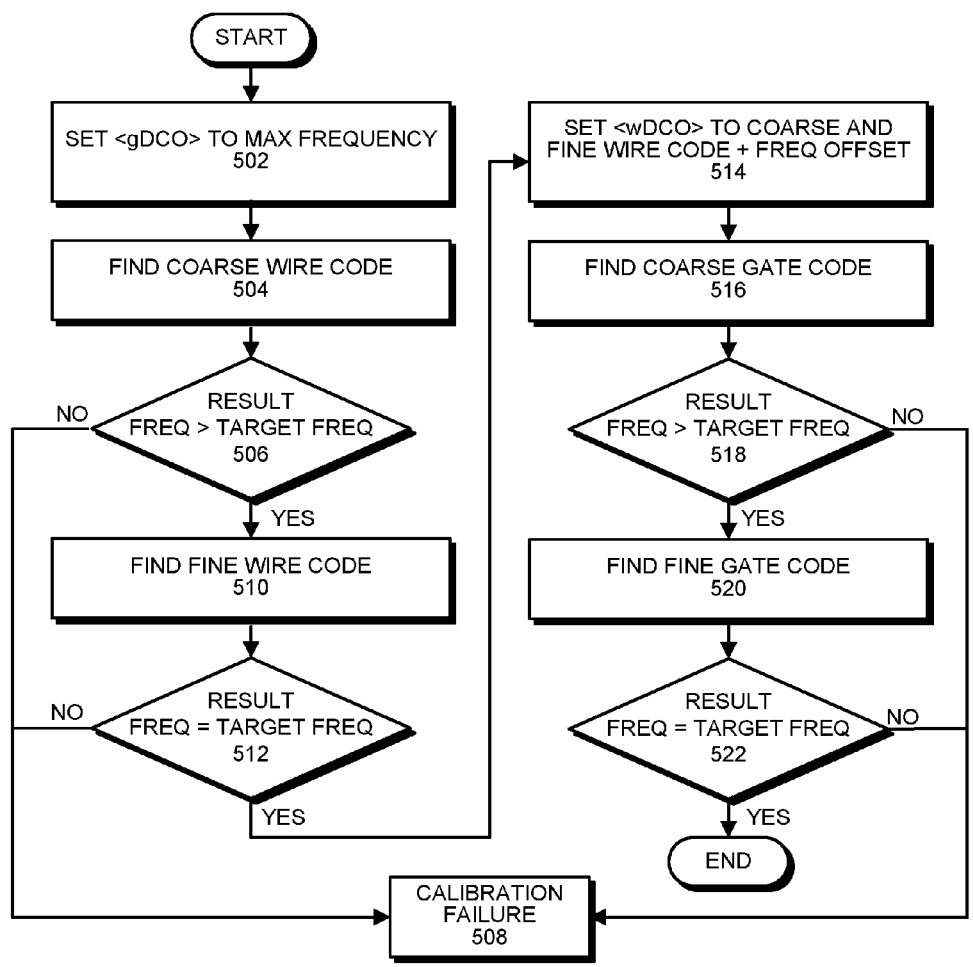
FIG. 5 presents a flow diagram illustrating a calibration procedure for the clock-generation circuit in accordance with the disclosed embodiments.

FIG. 5 presents a flow diagram illustrating a calibration procedure for the clock-generation circuit 206 illustrated in FIG. 2 in accordance with embodiments of the present disclosure. First, the system sets the first DCO, which has a gate-dominated delay characteristic (hereinafter "<gDCO>"), to a maximum frequency (step 502). Next, the system finds a coarse wire code for the second DCO, which has a wire-dominated delay characteristic (hereinafter "<wDCO>") (step 504). This can involve starting with the lowest possible coarse wire code and incrementing upwards until the target frequency is exceeded, or the maximum value for the coarse wire code is reached.

Next, the system determines whether the resulting frequency is greater than the target frequency (step 506). If not, a calibration failure occurs (step 508) because the coarse wire code could not be adjusted to reach the target frequency. Otherwise, if the resulting frequency is greater than the target frequency, the system finds the fine wire code (step 510). This can involve starting with the lowest possible fine wire code and incrementing upwards until the target frequency is reached, or the maximum value for the fine wire code is reached. Next, the system determines whether the resulting frequency equals the target frequency (step 512). If not, a calibration failure occurs (step 508).

Otherwise, if the resulting frequency equals the target frequency, the system sets the <wDCO> to the determined coarse and fine wire codes plus a frequency offset (step 514). Next, the system finds a coarse gate code for <gDCO> (step 516). This can involve starting with the lowest possible coarse gate code and incrementing upwards until the target frequency is exceeded, or the maximum value for the coarse gate code is reached.

Next, the system determines whether the resulting frequency is greater than the target frequency (step 518). If not, a calibration failure occurs (step 508) because the coarse gate code could not be adjusted to reach the target frequency. Otherwise, if the resulting frequency is greater than the target frequency, the system finds the fine gate code (step 520). This can involve starting with the lowest possible fine gate code and incrementing upwards until the target frequency is reached, or the maximum value for the fine date code is reached.

Next, the system determines whether the resulting frequency equals the target frequency (step 522). If not, a calibration failure occurs (step 508). Otherwise, if the resulting frequency equals the target frequency, all the gate coarse and fine codes and wire coarse and fine codes have been determined, and the process is complete.

Note that this calibration procedure can also be performed with the gate and wire codes swapped. In this scenario the <wDCO> is set to its maximum possible value, and the coarse and fine gate codes are determined. Next, <gDCO> is set to the determined coarse and fine gates codes plus a frequency offset and the coarse and fine wire codes are determined.

System

Figure 6:
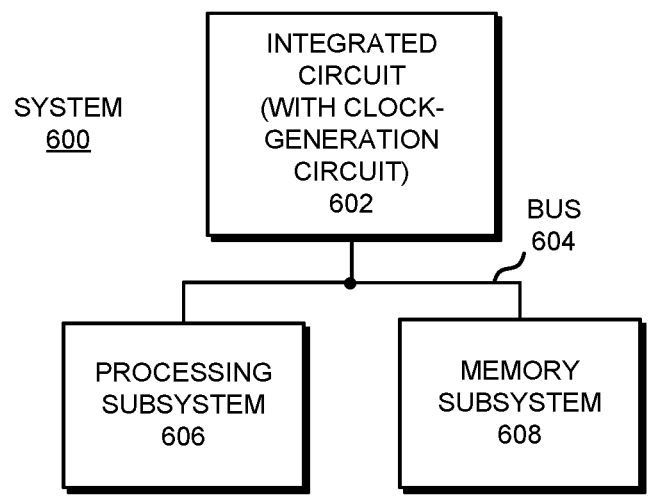
FIG. 6 presents a block diagram of an electronic device that includes an integrated circuit that includes a clock-generation circuit in accordance with the disclosed embodiments.

One or more of the preceding embodiments of the clock-generation circuit described above can be included in a system or device. More specifically, FIG. 6 illustrates a system 600 that includes an integrated circuit 602, which includes a clock-generation circuit. More specifically, system 600 also includes a processing subsystem 606 (with one or more processors) and a memory subsystem 608 (with memory).

In general, system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, the integrated circuit 602, which includes a clock-generation circuit, can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A clock-generation circuit that generates a clock signal, and which compensates for power-supply voltage variations in an integrated circuit, comprising:
   a first digitally controlled oscillator (DCO) having a first fundamental frequency;
   a second DCO having a second fundamental frequency;
   a Muller C-element, which combines outputs of the first and second DCOs to produce the clock signal, wherein the clock signal feeds back into the first and second DCOs; and
   control logic that calibrates the first and second DCOs with respect to a target frequency by performing the following operations:
      while the second DCO is set to a frequency that is larger than the target frequency, adjusting the first fundamental frequency of the first DCO with reference to a first feedback loop, which includes the first DCO, so that the clock signal matches the target frequency; and
      while the first DCO is set to the adjusted first fundamental frequency plus a frequency offset, adjusting the second fundamental frequency of the second DCO with reference to a second feedback loop, which includes the second DCO, so that the clock signal matches the target frequency.

2. The clock-generation circuit of claim 1,
   wherein adjusting the first fundamental frequency of the first DCO includes adjusting a coarse control code for the first DCO, and subsequently adjusting a fine control code for the first DCO; and
   wherein adjusting the second fundamental frequency of the second DCO includes adjusting a coarse control code for the second DCO, and subsequently adjusting a fine control code for the second DCO.

3. The clock-generation circuit of claim 1,
   wherein the first DCO is associated with a critical path having a gate-dominated delay characteristic; and
   wherein the second DCO is associated with a critical path having a wire-dominated delay characteristic.

4. The clock-generation circuit of claim 1,
   wherein the first DCO is associated with a critical path having a wire-dominated delay characteristic; and
   wherein the second DCO is associated with a critical path having a gate-dominated delay characteristic.

5. The clock-generation circuit of claim 4, wherein during normal operation of the clock-generation circuit, the Muller C-element selects the slowest of the outputs of the first and second DCOs so that:
   during a voltage undershoot of the power supply voltage, the gate-dominated delay characteristic determines the speed of the clock signal; and
   during a voltage overshoot of the power supply voltage, the wire-dominated delay characteristic determines the speed of the clock signal.

6. The clock-generation circuit of claim 1,
   wherein during the calibration operations for the clock-generation circuit, the control logic selectively enables the first feedback loop and the second feedback loop; and
   wherein during normal operation of the clock-generation circuit, the control logic disables the first feedback loop and the second feedback loop.

7. The clock-generation circuit of claim 1, wherein the power-supply voltage variations are associated with:
   a time-varying power-supply current; and
   an inductance of a chip package that includes the integrated circuit.

8. The clock-generation circuit of claim 1,
   wherein the target frequency falls in a range from 2 GHz to 5 GHz; and
   wherein the frequency offset increases the first fundamental frequency by 0.5 ps to 127.5 ps.

9. An electronic device, comprising:
   a processor;
   a memory storing a program module that is configured to be executed by the processor; and
   a clock-generation circuit, which generates a clock signal for the electronic device, wherein the clock-generation circuit comprises:
      a first digitally controlled oscillator (DCO) having a first fundamental frequency;
      a second DCO having a second fundamental frequency;
      a Muller C-element, which combines outputs of the first and second DCOs to produce the clock signal, wherein the clock signal feeds back into the first and second DCOs; and
      control logic that calibrates the first and second DCOs with respect to a target frequency by performing the following operations:
         while the second DCO is set to a frequency that is larger than the target frequency, adjusting the first fundamental frequency of the first DCO with reference to a first feedback loop, which includes the first DCO, so that the clock signal matches the target frequency; and
         while the first DCO is set to the adjusted first fundamental frequency plus a frequency offset, adjusting the second fundamental frequency of the second DCO with reference to a second feedback loop, which includes the second DCO, so that the clock signal matches the target frequency.

10. The electronic device of claim 9,
    wherein adjusting the first fundamental frequency of the first DCO includes adjusting a coarse control code for the first DCO, and subsequently adjusting a fine control code for the first DCO; and
    wherein adjusting the second fundamental frequency of the second DCO includes adjusting a coarse control code for the second DCO, and subsequently adjusting a fine control code for the second DCO.

11. The electronic device of claim 9,
wherein the first DCO is associated with a critical path having a gate-dominated delay characteristic; and
wherein the second DCO is associated with a critical path having a wire-dominated delay characteristic.

12. The electronic device of claim 9,
wherein the first DCO is associated with a critical path having a wire-dominated delay characteristic; and
wherein the second DCO is associated with a critical path having a gate-dominated delay characteristic.

13. The electronic device of claim 12, wherein during normal operation of the clock-generation circuit, the Muller-C element selects the slowest of the outputs of the first and second DCOs so that:
during a voltage undershoot of the power supply voltage, the gate-dominated delay characteristic determines the speed of the clock signal; and
during a voltage overshoot of the power supply voltage, the wire-dominated delay characteristic determines the speed of the clock signal.

14. The electronic device of claim 9,
wherein during the calibration operations for the clock-generation circuit, the control logic selectively enables the first feedback loop and the second feedback loop; and
wherein during normal operation of the clock-generation circuit, the control logic disables the first feedback loop and the second feedback loop.

15. The electronic device of claim 9, wherein the power-supply voltage variations are associated with:
a time-varying power-supply current; and
an inductance of a chip package that includes the integrated circuit.

16. The electronic device of claim 9,
wherein the target frequency falls in a range from 2 GHz to 5 GHz; and
wherein the frequency offset increases the first fundamental frequency by 0.5 ps to 127.5 ps.

17. A method for calibrating a clock-generation circuit, comprising:
powering up the clock-generation circuit, wherein the clock-generation circuit includes:
a first digitally controlled oscillator (DCO) having a first fundamental frequency;
a second DCO having a second fundamental frequency; and
a Muller C-element, which combines outputs of the first and second DCOs to produce the clock signal, wherein the clock signal feeds back into the first and second DCOs; and
while the clock-generation circuit is powered up, calibrating the clock-generation circuit with respect to a target frequency by performing the following operations:
while the second DCO is set to a frequency that is larger than the target frequency, adjusting the first fundamental frequency of the first DCO with reference to a first feedback loop, which includes the first DCO, so that the clock signal matches the target frequency; and
while the first DCO is set to the adjusted first fundamental frequency plus a frequency offset, adjusting the second fundamental frequency of the second DCO with reference to a second feedback loop, which includes the second DCO, so that the clock signal matches the target frequency.

18. The method of claim 17,
wherein adjusting the first fundamental frequency of the first DCO includes adjusting a coarse control code for the first DCO, and subsequently adjusting a fine control code for the first DCO; and
wherein adjusting the second fundamental frequency of the second DCO includes adjusting a coarse control code for the second DCO, and subsequently adjusting a fine control code for the second DCO.

19. The method of claim 17,
wherein the first DCO is associated with a critical path having a gate-dominated delay characteristic; and
wherein the second DCO is associated with a critical path having a wire-dominated delay characteristic.

20. The method of claim 17,
wherein the first DCO is associated with a critical path having a wire-dominated delay characteristic; and
wherein the second DCO is associated with a critical path having a gate-dominated delay characteristic.

* * * * *